(12) United States Patent
Kocon et al.

(10) Patent No.: US 7,132,712 B2
(45) Date of Patent: Nov. 7, 2006

(54) TRENCH STRUCTURE HAVING ONE OR MORE DIODES EMBEDDED THEREIN ADJACENT A PN JUNCTION

(75) Inventors: Christopher Boguslaw Kocon, Plains, PA (US); Joseph Andrew Yedinak, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/288,982

(22) Filed: Nov. 5, 2002

(65) Prior Publication Data

US 2004/0084721 A1    May 6, 2004

(51) Int. Cl.
    *H01L 29/72*    (2006.01)
(52) U.S. Cl. .................. 257/328; 257/329; 257/331
(58) Field of Classification Search ................ 257/328, 257/329, 331, 310
    See application file for complete search history.

(56) References Cited

U.S. PATENT DOCUMENTS

| | | | |
|---|---|---|---|
| 3,404,295 A | 10/1968 | Warner et al. | |
| 3,412,297 A | 11/1968 | Amlinger | |
| 3,497,777 A | 2/1970 | Teszner et al. | |
| 3,564,356 A | 2/1971 | Wilson | |
| 4,003,072 A | 1/1977 | Matsushita et al. | |
| 4,300,150 A | 11/1981 | Colak | |
| 4,326,332 A | 4/1982 | Kenney et al. | |
| 4,337,474 A | 6/1982 | Yukimoto | |
| 4,579,621 A | 4/1986 | Hine | |
| 4,638,344 A | 1/1987 | Cardwell, Jr. | |
| 4,639,761 A | 1/1987 | Singer et al. | |
| 4,698,653 A | 10/1987 | Cardwell, Jr. | |
| 4,716,126 A | 12/1987 | Cogan | |
| 4,746,630 A | 5/1988 | Hui et al. | |

(Continued)

FOREIGN PATENT DOCUMENTS

DE    4300806 A2    12/1993

(Continued)

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries(1985).

(Continued)

*Primary Examiner*—Edward Wojciechowicz
(74) *Attorney, Agent, or Firm*—Townsend and Townsend and Crew LLP

(57) ABSTRACT

In accordance with an embodiment of the invention, a semiconductor structure includes a semiconductor region having a P-type region and a N-type region forming a PN junction therebetween. A first trench extends in the semiconductor region adjacent at least one of the P-type and N-type regions. The first trench includes at least one diode therein.

41 Claims, 9 Drawing Sheets

U.S. PATENT DOCUMENTS

| | | |
|---|---|---|
| 4,754,310 A | 6/1988 | Coe |
| 4,774,556 A | 9/1988 | Fujii et al. |
| 4,821,095 A | 4/1989 | Temple |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,967,245 A | 10/1990 | Cogan et al. |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,071,782 A | 12/1991 | Mori |
| 5,072,266 A | 12/1991 | Buluccea et al. |
| 5,079,608 A | 1/1992 | Wodarczyk et al. |
| 5,105,243 A | 4/1992 | Nakagawa et al. |
| 5,164,325 A | 11/1992 | Cogan et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,262,336 A | 11/1993 | Pike, Jr. et al. |
| 5,268,311 A | 12/1993 | Euen et al. |
| 5,275,965 A | 1/1994 | Manning |
| 5,294,824 A | 3/1994 | Okada |
| 5,298,781 A | 3/1994 | Cogan et al. |
| 5,300,447 A | 4/1994 | Anderson |
| 5,326,711 A | 7/1994 | Malhi |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,436,189 A | 7/1995 | Beasom |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,519,245 A | 5/1996 | Tokura et al. |
| 5,541,425 A | 7/1996 | Nishihara |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,877,528 A | 3/1999 | So |
| 5,879,971 A | 3/1999 | Witek |
| 5,879,994 A | 3/1999 | Kwan et al. |
| 5,895,951 A | 4/1999 | So et al. |
| 5,895,952 A | 4/1999 | Darwish et al. |
| 5,897,360 A | 4/1999 | Kawaguchi |
| 5,906,680 A | 5/1999 | Meyerson |
| 5,917,216 A | 6/1999 | Floyd et al. |
| 5,929,481 A | 7/1999 | Hshieh et al. |
| 5,943,581 A | 8/1999 | Lu et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,976,936 A | 11/1999 | Miyajima et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,049,108 A | 4/2000 | Williams et al. |
| 6,057,558 A | 5/2000 | Yamamoto et al. |
| 6,066,878 A | 5/2000 | Neilson |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,156,606 A | 12/2000 | Michaelis |
| 6,156,611 A | 12/2000 | Lan et al. |
| 6,163,052 A | 12/2000 | Liu et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,191,447 B1 | 2/2001 | Baliga |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,225,649 B1 | 5/2001 | Minato |
| 6,228,727 B1 | 5/2001 | Lim et al. |
| 6,239,464 B1 | 5/2001 | Tsuchitani et al. |
| 6,265,269 B1 | 7/2001 | Chen et al. |
| 6,271,100 B1 | 8/2001 | Ballantine et al. |
| 6,271,562 B1 | 8/2001 | Deboy et al. |
| 6,274,904 B1 * | 8/2001 | Tihanyi ............... 257/329 |
| 6,274,905 B1 | 8/2001 | Mo |

| | | | |
|---|---|---|---|
| 6,277,706 B1 | 8/2001 | Ishikawa | |
| 6,285,060 B1 | 9/2001 | Korec et al. | |
| 6,291,298 B1 | 9/2001 | Williams et al. | |
| 6,291,856 B1 | 9/2001 | Miyasaka et al. | |
| 6,294,818 B1 | 9/2001 | Fujihira | |
| 6,297,534 B1 | 10/2001 | Kawaguchi et al. | |
| 6,303,969 B1 | 10/2001 | Tan | |
| 6,307,246 B1 | 10/2001 | Nitta et al. | |
| 6,309,920 B1 | 10/2001 | Laska et al. | |
| 6,313,482 B1 | 11/2001 | Baliga | |
| 6,326,656 B1 | 12/2001 | Tihanyi | |
| 6,337,499 B1 | 1/2002 | Werner | |
| 6,346,464 B1 | 2/2002 | Takeda et al. | |
| 6,346,469 B1 | 2/2002 | Greer | |
| 6,353,252 B1 | 3/2002 | Yasuhara et al. | |
| 6,359,308 B1 | 3/2002 | Hijzen et al. | |
| 6,362,112 B1 | 3/2002 | Hamerski | |
| 6,362,505 B1 | 3/2002 | Tihanyi | |
| 6,365,462 B1 | 4/2002 | Baliga | |
| 6,365,930 B1 | 4/2002 | Schillaci et al. | |
| 6,368,920 B1 | 4/2002 | Beasom | |
| 6,368,921 B1 | 4/2002 | Hijzen et al. | |
| 6,376,314 B1 | 4/2002 | Jerred | |
| 6,376,878 B1 | 4/2002 | Kocon | |
| 6,376,890 B1 | 4/2002 | Tihanyi | |
| 6,384,456 B1 | 5/2002 | Tihanyi | |
| 6,388,286 B1 | 5/2002 | Baliga | |
| 6,388,287 B1 | 5/2002 | Deboy et al. | |
| 6,400,003 B1 | 6/2002 | Huang | |
| 6,433,385 B1 | 8/2002 | Kocon et al. | |
| 6,436,779 B1 | 8/2002 | Hurkx et al. | |
| 6,437,399 B1 | 8/2002 | Huang | |
| 6,441,454 B1 | 8/2002 | Hijzen et al. | |
| 6,452,230 B1 | 9/2002 | Boden, Jr. | |
| 6,465,304 B1 | 10/2002 | Blanchard et al. | |
| 6,465,843 B1 | 10/2002 | Hirler et al. | |
| 6,465,869 B1 | 10/2002 | Ahlers et al. | |
| 6,472,678 B1 | 10/2002 | Hshieh et al. | |
| 6,472,708 B1 | 10/2002 | Hshieh et al. | |
| 6,475,884 B1 | 11/2002 | Hshieh et al. | |
| 6,476,443 B1 | 11/2002 | Kinzer | |
| 6,479,352 B1 | 11/2002 | Blanchard | |
| 6,501,146 B1 | 12/2002 | Harada | |
| 2001/0023961 A1 | 9/2001 | Hsieh et al. | |
| 2001/0028083 A1 | 10/2001 | Onishi et al. | |
| 2001/0032998 A1 | 10/2001 | Iwamoto et al. | |
| 2001/0041400 A1 | 11/2001 | Ren et al. | |
| 2001/0049167 A1 | 12/2001 | Madson | |
| 2001/0050394 A1 | 12/2001 | Onishi et al. | |
| 2002/0009832 A1 | 1/2002 | Blanchard | |
| 2002/0014658 A1 | 2/2002 | Blanchard | |
| 2002/0068924 A1 | 6/2002 | Blanchard | |
| 2002/0070418 A1 | 6/2002 | Kinzer et al. | |
| 2003/0132450 A1* | 7/2003 | Minato et al. | 257/110 |

FOREIGN PATENT DOCUMENTS

| | | |
|---|---|---|
| DE | 19736981 A1 | 8/1998 |
| EP | 0975024 A2 | 1/2000 |
| EP | 1026749 A1 | 8/2000 |
| EP | 1054451 A2 | 11/2000 |
| EP | 0747967 B1 | 2/2002 |
| EP | 1205980 A1 | 5/2002 |
| JP | 62-069562 | 3/1987 |
| JP | 63-188475 | 8/1988 |
| JP | 63-288047 | 11/1988 |
| JP | 64-022051 | 1/1989 |
| JP | 01-192174 | 8/1989 |
| JP | 05226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 11/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/047171 A1 | 6/2002 |

OTHER PUBLICATIONS

Baliga "Options for CVD of Dielectrics Include Low-k Materials," Technical Literature from Semiconductor International Jun. 1998.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 38:2623 (1989).

Chang et al. "Self-Aligned UMOSFET's with a Specific On-Resistance of 1mQ cm$^2$," IEEE Transactions on Electron Devices 34:2329-2333 (1987).

Curtis, et al. "APCVD TEOS: 03 Advanced Trench Isolation Applications," Semiconductor Fabtech 9th Edition (1999).

Darwish et al. A New Power W-Gated Trench MOSFET (WMOSFET) with High Switching Performance. ISPSD Proceedings—Apr. 2003, Cambridge.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001).

Glenn et al. "A Novel Vertical Deep Trench Resurf DMOS (VTR-DMOS)" IEEE ISPD 2000, May 22-25, Toulouse France.

Kao et al. "Two Dimensional Thermal Oxidation of Silicon-I, Experiments,", *IEEE Transactions on Electron Devices*, vol. ED-34,No. 5, May 1987.

Kao et al. "Two Dimensional Thermal Oxidation of Silicon-II. Modeling Stress Effects in Wet Oxides,", *IEEE Transactions on Electron Devices*, vol. ED-35, No. 1, Jan. 1988.

Lorenz et al. "Cool MOS- An important milestone towards a new power MOSFET generation" Power Conversion pp. 151-160 (1988).

Moghadam "Delivering Value Around New Industry Paradigms," Technical Literature from Applied Materials, pp. 1-11, vol. 1, Issue 2, Nov. 1999.

Shenoy et al."Analysis of the Effect of Charge Imbalance on the Static and Dynamic Characteristics of the Super Junction MOSFET," IEEE International Symposium on Power Semiconductor Devices 1999, pp. 99-102 (1999).

Singer "Empty Spaces In Silicon (ESS): An Alternative to SOI," Semiconductor International p. 42, Dec. 1999.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf "Silicon Processing for The VLSI Era" vol. 2 Process Integration Lattice Press (1990).

"CoolMOS™ the second generation," Infineon Technologies product information (2000).

"IR develops CoolMOS™ -equivalent technology, positions it at the top of a 3-tiered line of new products for SMPS," International Rectifiers company information available at http://www.irf.com (1999).

Technical Literature from Quester Technology, Model APT-4300 300mm Atmospheric TEOS/Ozone CVD System (unknown date).

Technical Literature from Quester Technology, Model APT-6000 Atmospheric TEOS-Ozone CVD System (unknown date).

Technical Literature from Silicon Valley Group Thermal Systems, APNext, High Throughput APCVD Cluster Tool for 200 mm/300 mm Wafer Processing (unknown date).

* cited by examiner

TRENCH STRUCTURE HAVING ONE OR MORE DIODES EMBEDDED THEREIN ADJACENT A PN JUNCTION

CROSS-REFERENCES TO RELATED APPLICATIONS

The present application incorporates herein by reference commonly assigned U.S. application Ser. No. 08/970,221, filed on Nov. 14, 1997, entitled "Field Effect Transistor and Method of its Manufacture".

BACKGROUND OF THE INVENTION

The present invention relates in general to semiconductor technology and in particular to high-voltage semiconductor structures and methods of manufacturing the same.

FIG. 1 shows a cross-section view of a portion of a conventional power MOSFET having a buried-gate structure. A highly-doped substrate 102 forms the drain contact for MOSFET 100. An epitaxial layer 104 formed over substrate 102 includes source regions 124a,b formed in body regions 108a,b. Body regions 108a,b are flanked on one side by gate trench 119. P+ regions 126a,b form the areas through which contact is made to body regions 108a,b. Gate trench 119 is filled with polysilicon forming the MOSFET gate 118. When MOSFET 100 is turned on, current travels in a vertical direction from source regions 124a,b along a channel parallel to the sidewalls of gate trench 119 to the backside drain.

FIG. 2 shows a cross-section view of a conventional MOSFET 200 with planar gate structure. A highly doped substrate 202 forms the drain contact for MOSFET 200. An epitaxial layer 204 formed over substrate 202 includes source regions 224a,b formed in body regions 208a,b. P+ regions 226a,b form the areas through which contact is made to body regions 208a,b. The MOSFET gate 218 is formed on top of the silicon surface instead of being recessed in a trench. When MOSFET 200 is turned on, current flows from source regions 224a,b along a channel beneath gate 118 and then vertically through drift region 206 to the backside drain.

The structures shown in FIGS. 1 and 2 are typically repeated many times to form an array of cells. The array may be configured in various cellular or stripe layouts known to one skilled in this art. These and other types of power devices have long been known. Recent advances in semiconductor manufacturing have increased the density (i.e., the number of cells in a given silicon area) of devices. However, the higher density does not necessarily improve power loss in mid to high voltage range (e.g., 60 to 2000 volts) devices. In such devices, the power loss is primarily due to the high resistivity of the drift region (e.g., region 106 in FIG. 1). Drift regions have high resistivity because in order for the device to sustain the high voltages during the blocking state, the drift region is lightly doped. The high resistivity of the drift region results in a higher on-resistance, which in turn results in high power loss. Since a high blocking voltage is a critical feature for mid to high voltage power devices, increasing the drift region doping is not an option. Similar issues are present in power diode devices.

Attempts have been made to improve the device power loss while maintaining a high blocking voltage. In one approach, columnar opposite polarity regions extending parallel to the current flow are formed between the body-gate structure at the top and the substrate at the bottom. The columnar opposite polarity regions prevent the electric field from decreasing linearly away from the base-drift junction, thus allowing the device to support higher blocking voltages. This technique however depends on charge balance between the conduction and opposite polarity regions and thus requires precise doping control of the opposite polarity regions. The opposite polarity regions are formed before the diffused base and source regions. When the base and source regions are annealed during a thermal cycle, the dopants in the opposite polarity regions undesirably diffuse into each other. This dopant inter-diffusion makes the thermal processing difficult and limits shrinking of the cell pitch. The inability to shrink the cell pitch is specially problematic in mid to low voltage devices in which the power loss occurs primarily in the channel region rather than in the drift region. In the mid to low voltage devices, the power loss in the channel region is typically countered by making the cell pitch as small as possible so that a large number of cells can be formed in the same silicon area. The columnar opposite polarity regions technique is thus unattractive for mid to low voltage devices as it can not be shrunk.

Thus, a technique which enables achieving a high device blocking capability, low on-resistance, and high current handling capability without preventing the cell pitch to be shrunk is desirable.

BRIEF SUMMARY OF THE INVENTION

In accordance with an embodiment of the invention, a semiconductor structure includes a semiconductor region having a P-type region and a N-type region forming a PN junction therebetween. A first trench extends in the semiconductor region adjacent at least one of the P-type and N-type regions. The first trench includes at least one diode therein.

In one embodiment, the diode is reverse biased during semiconductor structure operation.

In another embodiment, the first trench further includes an insulating layer which extends along sidewalls of the first trench but is discontinuous along the bottom of the first trench.

In another embodiment, the semiconductor region is an epitaxial layer formed over and in contact with a substrate.

In another embodiment, one of the P-type and N-type regions forms a drift region, and the diode is arranged in the first trench such that when the semiconductor structure is biased in a blocking state, an electric field induced in the at least one diode influences an electric field in the drift region to thereby increase the blocking voltage of the semiconductor structure.

In another embodiment, one of the P-type and N-type regions forms a drift region, and the diode is arranged in the first trench such that when the semiconductor structure is biased in a blocking state an electric field induced in the at least one diode results in a uniform charge distribution in the drift region.

In another embodiment, the semiconductor structure is a MOSFET which includes a second trench in the semiconductor region. The second trench has a gate therein and is laterally spaced from the first trench.

In another embodiment, the semiconductor structure is a MOSFET which includes a planar gate structure along a surface region of the semiconductor region. The gate structure is laterally spaced from the first trench.

In another embodiment, the semiconductor structure is a MOSFET, and the first trench further includes a gate over but insulated from the diode.

In another embodiment, the semiconductor structure is a MOSFET which includes a drain terminal and a source terminal both located along one surface of the semiconductor structure. The trench extends laterally between the drain terminal and the source terminal.

In another embodiment, the semiconductor structure is a rectifier which includes an anode terminal electrically connected to one of the P-type and N-type regions and a cathode terminal electrically connected to the other one of the P-type and N-type regions.

In one embodiment, the first trench is a narrow and deep trench extending vertically between two opposite surfaces of the semiconductor structure, and alternatively the first trench is a wide and shallow trench extending laterally parallel to a surface of the semiconductor structure.

The following detailed description and the accompanying drawings provide a better understanding of the nature and advantages of the present invention.

DETAILED DESCRIPTION OF THE INVENTION

Embodiments of a trench having one or more diodes embedded therein and methods of forming the same are described in accordance with the invention. The diode trench structure can be used in semiconductor devices required to withstand high voltages. The diode trench helps achieve high current capability, high breakdown voltage, low forward voltage drop, and a small cell pitch.

Figure 3A:
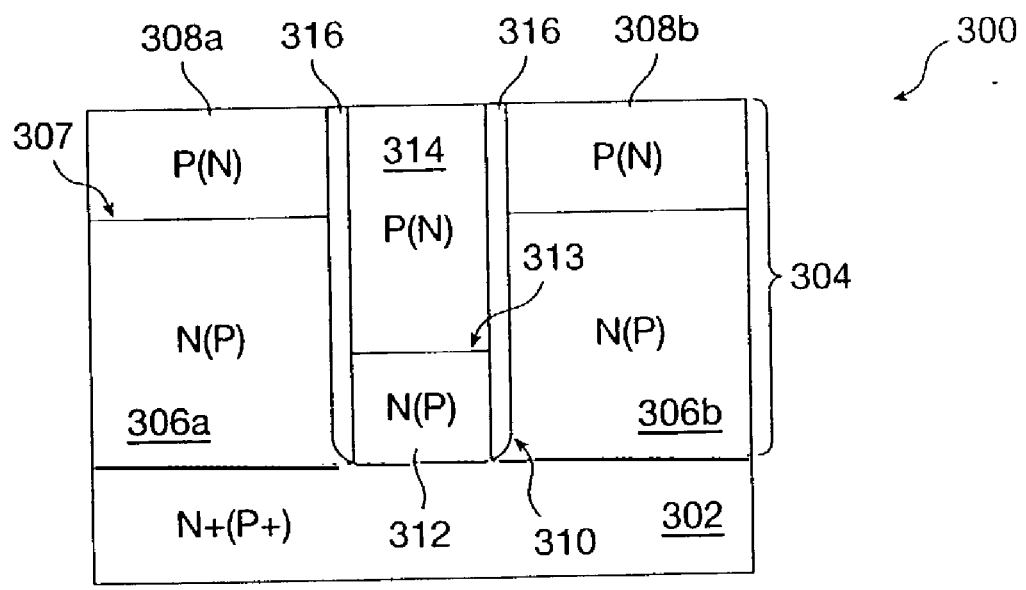
FIGS. 3A and 3B show cross-section views of two embodiments of the trench structure in accordance with the present invention.

FIG. 3A shows a cross-section view of a semiconductor structure 300 having a trench 310 in accordance with one embodiment of the present invention. An epitaxial layer 304 is formed over and is of the same conductivity type as a substrate 302. Regions 308 a,b of opposite conductivity type to epitaxial layer 304 is formed along a top portion of epitaxial layer 304. Trench 310 extends from a top surface of epitaxial layer 304 through to substrate 310. Trench 310 may alternatively be terminated at a shallower depth (i.e., within regions 306 a,b of epitaxial layer 304. ) Trench 310 includes a diode made up of opposite conductivity type regions 312 and 314 forming a PN junction 313 therebetween. Doped polysilicon or N-type and P-type silicon may be used to form regions 312 and 314. Other material suitable for forming such diode (e.g., Silicon Carbide, Gallium Arsenide, Silicon Germanium) may also be used.

Insulating layer 316 extending along the trench sidewalls insulates the diode in the trench from regions 306*a,b* and P 308*a,b* in epitaxial layer 304. Oxide may be used as insulating layer 316. As shown, there is no insulating layer along the bottom of the trench thus allowing the bottom region 312 of the trench diode to be in electrical contact with the underlying substrate 302. In one embodiment, similar considerations to those dictating the design and manufacture of the gate oxide of MOS transistors are applied in designing and forming insulating layer 316. For example, as in gate oxide of MOS transistors, the thickness of insulating layer 316 is determined by such factors as the voltage that insulating layer 316 is required to sustain and the extent to which the electric field in the trench diode is to be induced in regions 306*a,b* (i.e., the extent of coupling through the insulating layer).

Although regions 312 and 314 in trench 310 are shown to be N-type and P-type respectively, their conductivity type may be reversed. Also, either of regions 312 and 314 may be independently biased if desired by, for example, extending one or both regions along the third dimension (i.e., perpendicular to the page) and then up to the silicon surface where contact can be made to them. Although only two regions of opposite conductivity is shown in trench 310, three regions forming an NPN or PNP stack, or any number of regions of alternating conductivity may be formed in trench 310. Further, multiple trenches may be used as needed. Substrate 302 and regions 306*a,b* are shown to be of N-type conductivity and regions 308*a,b* of P-type conductivity. Alternatively, these regions may be of opposite conductivity type as shown in the parentheses in FIG. 3A.

Structure 300 may be incorporated in any power device such as a power MOSFET or a power diode. In any of these devices, when the device is biased to be in the blocking state (e.g., when a MOSFET is turned off, or a diode is reverse biased), PN junction 307 is reverse biased and is required to sustain high voltages. As is well-known in this art, under reverse-bias conditions, the electric field is highest at junction 307 and linearly reduces in N-type region 306*a,b* and P-type 308*a,b* in the direction away from junction 307 at a rate dictated by the doping concentration of the P-type and N-type regions. It is also well known that the larger the area under the electric field curve (i.e., the lower the rate at which the electric field reduces), the greater is the breakdown voltage. During operation, the diode embedded in trench 310, similar to PN junction 307, is reverse biased and thus the electric field is highest at the diode junction 313. Through insulating layer 316, the electric field in the trench diode induces a corresponding electric field in N-type regions 306*a,b*. The induced field is manifested in N-type regions 306*a,b* in the form of an up-swing spike and a general increase in the electric field curve in N-type regions 306*a,b*. This increase in the electric field results in a larger area under the electric field curve which in turn results in a higher breakdown voltage.

It can be seen that by using multiple diodes in trench 310, multiple spikes can be induced along the depth of N-type regions 306*a,b* (this is explained in more detail in reference to FIGS. 9 and 10 further below). This results in an electric field curve which tapers down from its highest level at junction 307 at a far lower rate than in conventional structures. An almost square-shaped area can thus be obtained under the electric field curve in N-type regions 306*a,b* as opposed to the conventional triangular shape. A far greater breakdown voltage can thus be obtained.

When structure 300 is biased in the conduction state (e.g., when a MOSFET is turned on or a diode device is forward biased) current passes through N-type regions 306*a,b*. In conventional structures such as structure 100 in FIG. 1, during the conduction state, junction 107 is reverse biased and the amount of charge in the corresponding depletion region linearly decreases from junction 107 toward the edge of the depletion region in N-type region 106. However, by introducing diode trench 310, the electric filed across the reverse-biased trench diode influences the charge distribution in N-type regions 306a,b such that a more uniform charge spreading is obtained in N-type regions 306a,b. That is, the amount of charge in the depletion region remains relatively uniform across N-type regions 306a,b. By spreading the charge more uniformly in N-type regions 306a,b, the silicon area taken up by N-type regions 306a,b is more efficiently used. Hence, for the same size N-type regions 306a,b, the portion of the device on-resistance attributable to regions 306a,b is, in effect, reduced. This enables reducing the cell pitch for the same on-resistance.

Accordingly, diode trench 310 enables optimizing structure 300 to have higher breakdown voltage, lower on-resistance, and smaller cell pitch than can be achieved by conventional techniques.

A method of forming structure 300 in accordance with one embodiment of the invention is as follows. An epitaxial layer 304 is formed over substrate 302 using conventional methods. A blanket P-well implant is carried out in accordance with known implant techniques. An anneal step may be carried out to drive the P-well deeper into epitaxial layer 304 and to activate the P dopants. A trench mask defining a trench opening is then formed by depositing and patterning a photoresist layer. Silicon is removed from the defined trench opening to form trench 310. The trench surfaces are then cleaned and a thin layer of thermal oxide is grown inside the deep trenches. A thicker (e.g. 200–600 nm) insulating layer (e.g., CVD oxide) is then deposited over the thin layer of thermal oxide. The sidewalls of the trench are thus coated with an insulating layer. The insulating material along the bottom of the trench is then removed. A suitable spacer material (e.g., nitride) may be used to protect the insulating material along the trench sidewalls during removal of insulation material at the trench bottom. In the embodiment wherein doped polysilicon is used to form the trench diode, the diode is formed by performing a two step process of polysilicon deposition followed by polysilicon etch for each region of the diode. In the embodiment wherein the trench diode is from silicon material, the diode is formed by performing silicon deposition for each diode region using conventional selective epitaxial growth techniques. The steps for forming the diode can be repeated to form additional diodes in the trench. If a large number of stacked polysilicon diodes is required, a cluster tool commonly used to combine the steps of polysilicon deposition and polysilicon etch may be used to speed up the processing time.

In an alternate embodiment, the process steps are reversed in that the diode trench is formed first (using the same steps outlined above) and then the P-well is formed (using the same process steps outlined above).

By properly designing the P-type and N-type regions of the trench diode, the trench diode's advantageous impact on charge spreading in N-type regions 306a,b can be enhanced. Two factors impacting the charge spreading are the avalanche breakdown voltage of the trench diode and the width of the depletion region in the trench diode. For example, by selecting proper doping concentration for each of the P-type and N-type regions of the trench diode, a high avalanche breakdown voltage can be obtained so that a maximum electric field of much greater magnitude than the conventional $2 \times 10^5$ V/cm can be obtained. The only limitation in obtaining the maximum electric field then becomes the ability of insulating layer 316 to withstand high voltages. This limitation can however be eliminated by the proper design of insulating layer 316. Typical gate oxide layers have a maximum electric field exceeding $3.5 \times 10^5$ V/cm which suffices for many high voltage applications.

Figure 3B:
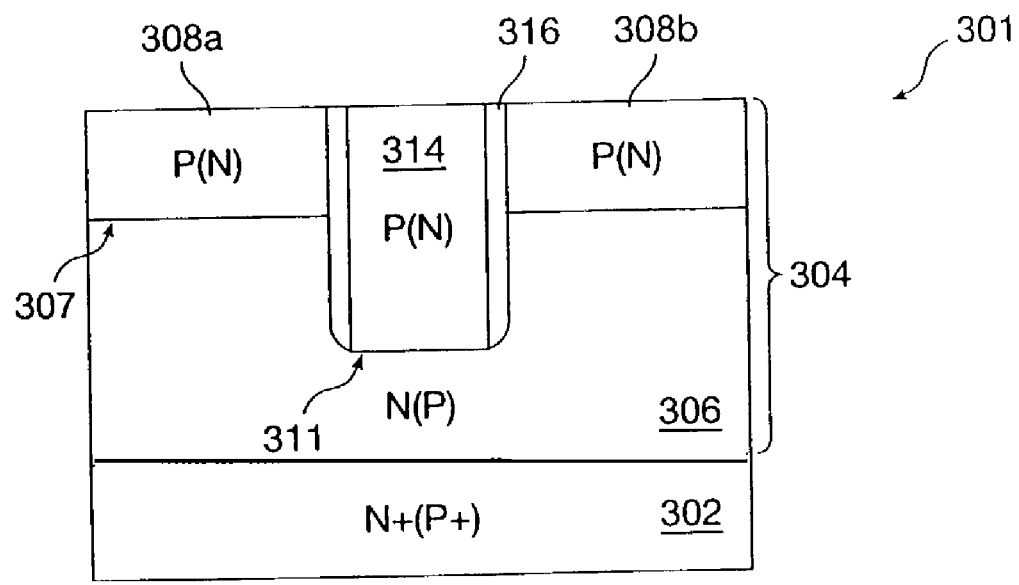

In another embodiment shown in FIG. 3B, trench 310 is terminated at a shallower depth within (e.g., in the middle of) N-type region 306. P-type region 314 fills the entire trench. In this embodiment, although a diode is not embedded within the trench, a diode is nevertheless formed by P-type region 314 and the underlying N-type region 306. During operation, this diode influences N-type region 306 in a similar manner to the diode embedded in the FIG. 3A trench 310.

Figure 3C:
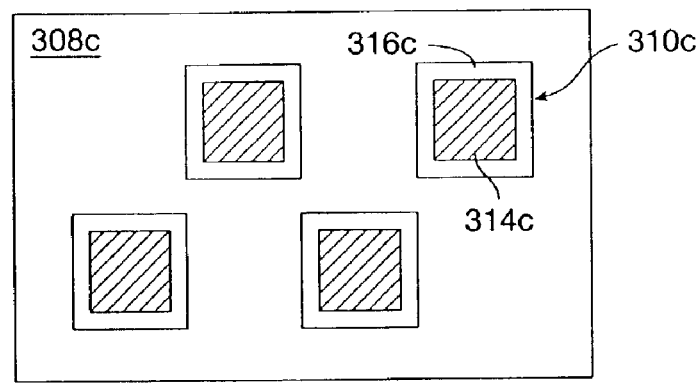
FIGS. 3C–3D are top views of three exemplary layout designs of the structures shown in FIGS. 3A and 3B.
Figure 3D:
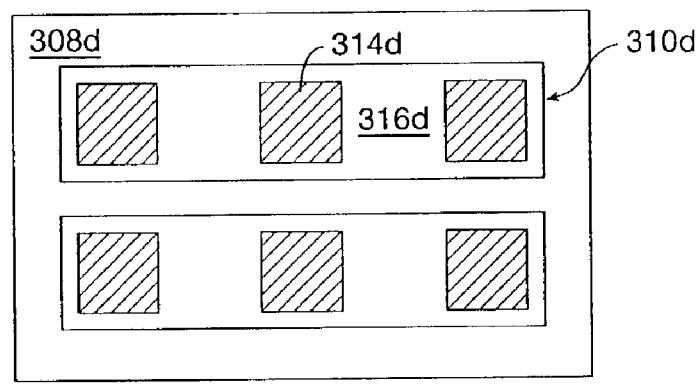
Figure 3E:
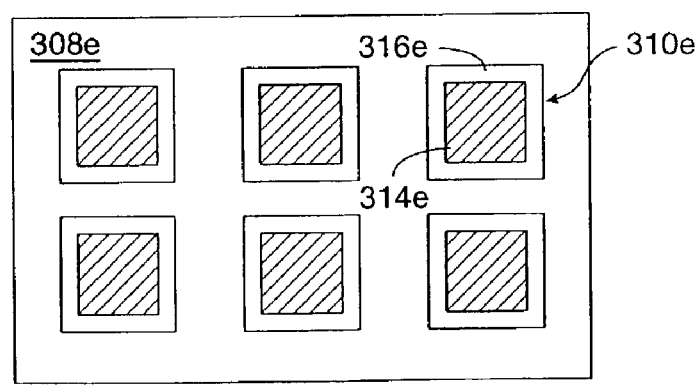

The spacings and trench diode arrangement can be implemented in various stripe or cellular designs. A top view of three exemplary designs are shown in FIGS. 3C, 3D, and 3E. In FIG. 3C, trenches 310c are offset from one another, while FIG. 3E shows trenches 310e to be aligned and arranged along rows and columns. In FIG. 3D, horizontally-extending diode trenches 310d are arranged as parallel stripes. Diode regions 314d insulated from one another by insulating material 316d are laterally spaced from each other in each trench stripe 310d. Although the trench regions and the diode regions embedded therein are shown as square or rectangular shaped regions, they may be designed as circular, oval, hexagonal, or any other geometric shape that is desired. Thus, many different designs, configurations, and geometric shapes can be envisioned by one skilled in the art in light of this disclosure.

Figure 4:
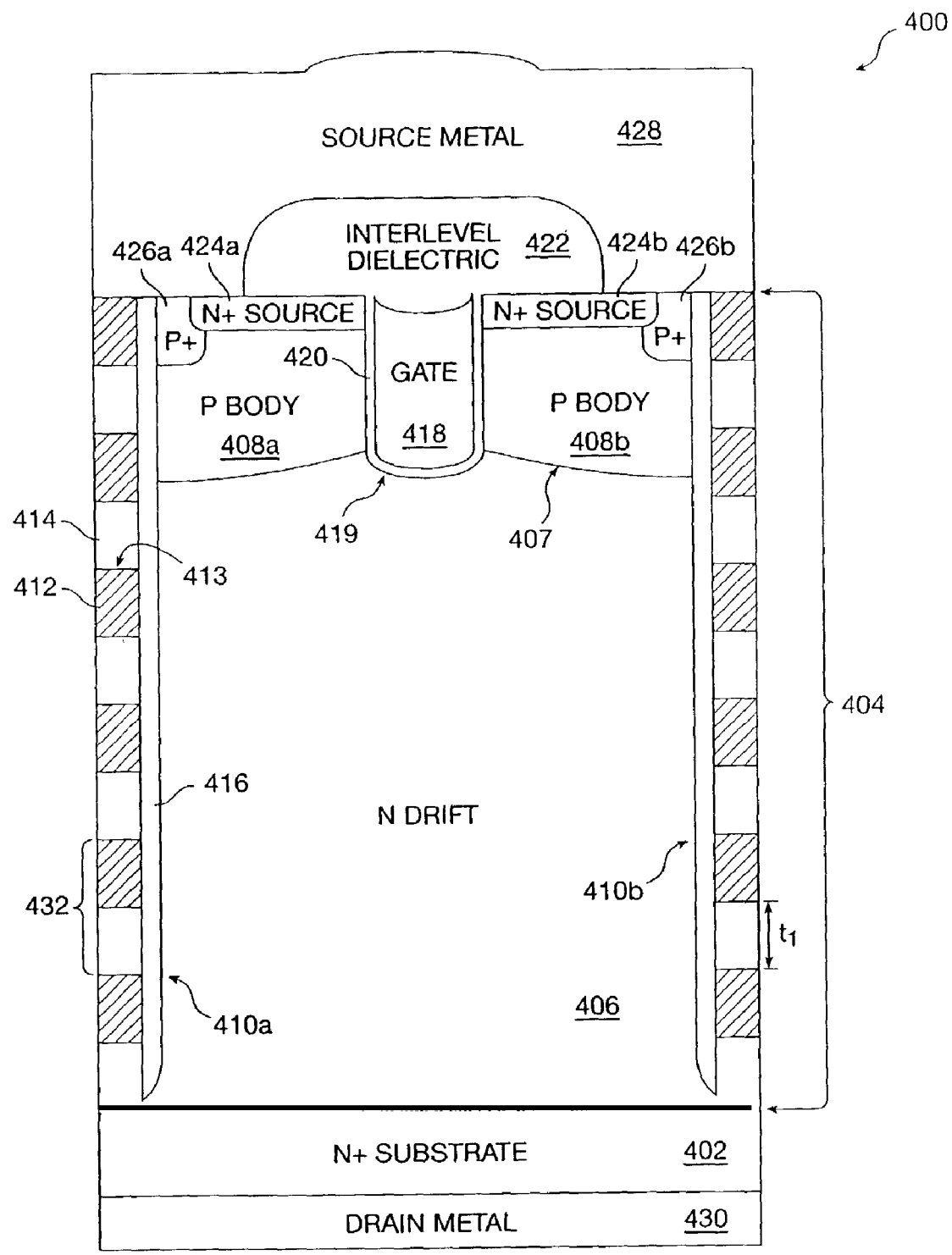
FIGS. 4–6 show cross-section views of three exemplary vertical MOSFET structures having diode trenches in accordance with the present invention.

FIG. 4 shows a cross-section view of a dual-trench MOSFET 400 in accordance with an embodiment of the present invention. A highly-doped substrate 402 forms the drain contact for MOSFET 400. An epitaxial layer 404 formed over substrate 402 includes source regions 424a,b formed in body regions 408a,b. Body regions 408a,b are flanked by gate trench 419 on one side and diode trenches 410a,b on the other. P+ regions 426a,b form the areas through which contact is made to body regions 408a,b. The portion of epitaxial layer 404 bounded by diode trenches 410a,b along the sides, body regions 408a,b and gate trench 419 along the top, and substrate 402 along the bottom forms drift region 406. The gate structure is similar to the gate structure in the prior art FIG. 1 structure 100. Metal layer 428 extends along the top and makes contact with sources 424a,b, P+ regions 426a,b, and the top of diode trenches 410a,b, but is isolated from gate 418 by insulating layer 422. Metal layer 430 makes contact to substrate 402 along the bottom and forms the drain electrode.

Diode trenches 410a,b extend from the top surface of epitaxial layer 404 to the bottom of drift region 406. Diode trenches 410a,b include a stack of alternating P-type region 412 and N-type region 414 forming a number of serially-connected diodes 432. The trench diodes are insulated from drift region 406 by an insulating layer 416 extending along the trench sidewalls. Insulating layer 416 however, is discontinuous along the bottom of diode trenches 410a,b to allow the bottom-most region in the diode trenches to make electrical contact with its underlying region (e.g., with drift region 406 or substrate 402).

The diodes in trenches 410a,b are reverse-biased during MOSFET operation. In the FIG. 4 implementation, this is achieved by connecting the top-most region in trenches 410a,b to the source and the bottom-most region to the drain. Alternatively, the top-most region may be connected to a low potential (e.g., ground) separate from the source or even allowed to float, and the bottom-most region may be connected to a high potential separate from the drain. Generally, reverse biasing of the diodes can be achieved by connecting any of the N-type regions in the diode trenches to a high potential, or alternatively connecting any of the P-type regions in the trenches to a low potential. Any one or more of the P-type and N-type regions in the diode trenches can be independently biased by, for example, extending the one or more regions along the third dimension (i.e., perpendicular to the page) and then up to the silicon surface where contact can be made to them.

Figure 1:
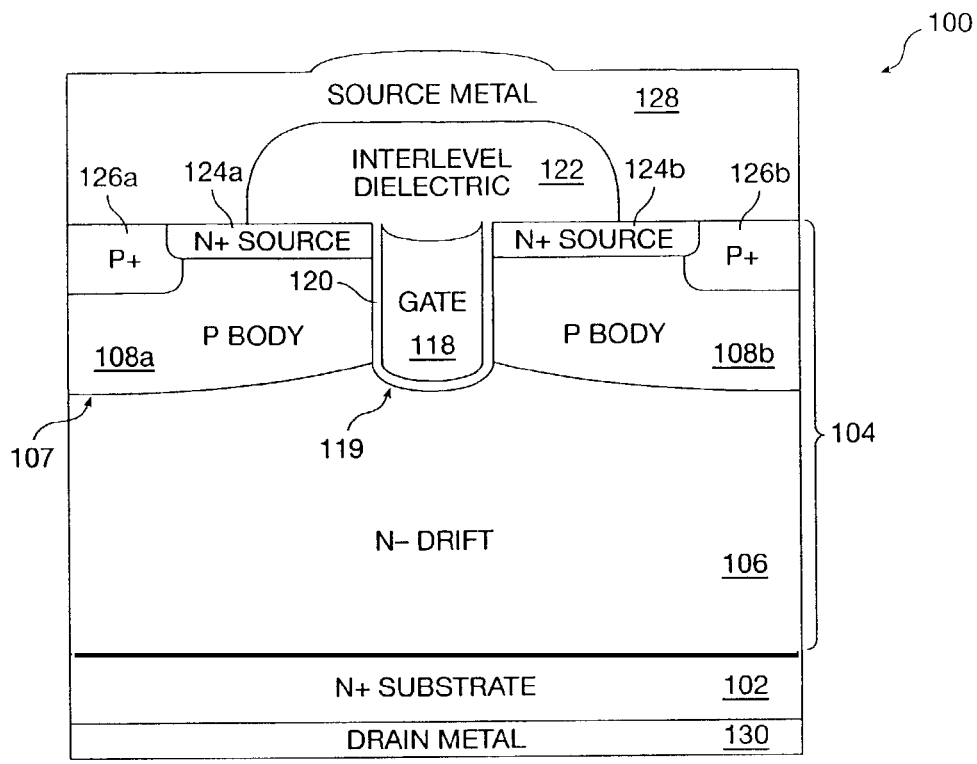
FIGS. 1 and 2 show cross-section views of two conventional MOSFET structures.

The operation of vertical MOSFET 400 is similar to that of the prior art FIG. 1 and thus will not be described. However, the advantageous impact of diode trenches 410a,b on the performance characteristics of MOSFET 400 is described next using the graphs in FIGS. 9 and 10. The graphs in FIGS. 9 and 10 are obtained from simulation results, and show the electric field curve through diode trenches 410a,b and drift zone 406 of an exemplary MOSFET similar in structure to MOSFET 400, respectively. The vertical axis in FIGS. 9 and 10 represents electric field and the horizontal axis represents dimension. In FIG. 9, the horizontal axis from left to right corresponds to the vertical dimension through the diode trench from top to bottom. In FIG. 10, the horizontal axis from left to right corresponds to the vertical dimension from body-drift junction 407 to the drift-substrate junction. The following table sets forth the values used for some of the simulation parameters. These values are merely exemplary and not intended to be limiting.

| Parameter | Value |
| --- | --- |
| Epi doping | $2 \times 10^{15}$ cm$^{-3}$ |
| Diode doping (N-type and P-type) | $1 \times 10^{16}$ cm$^{-3}$ |
| Thickness $t_1$ of each of the N-type and P-type regions in diode trenches | 0.5 μm |
| Thickness of oxide along trench sidewalls | 500 Å |
| Thickness of gate oxide | 500 Å |

Figure 9:
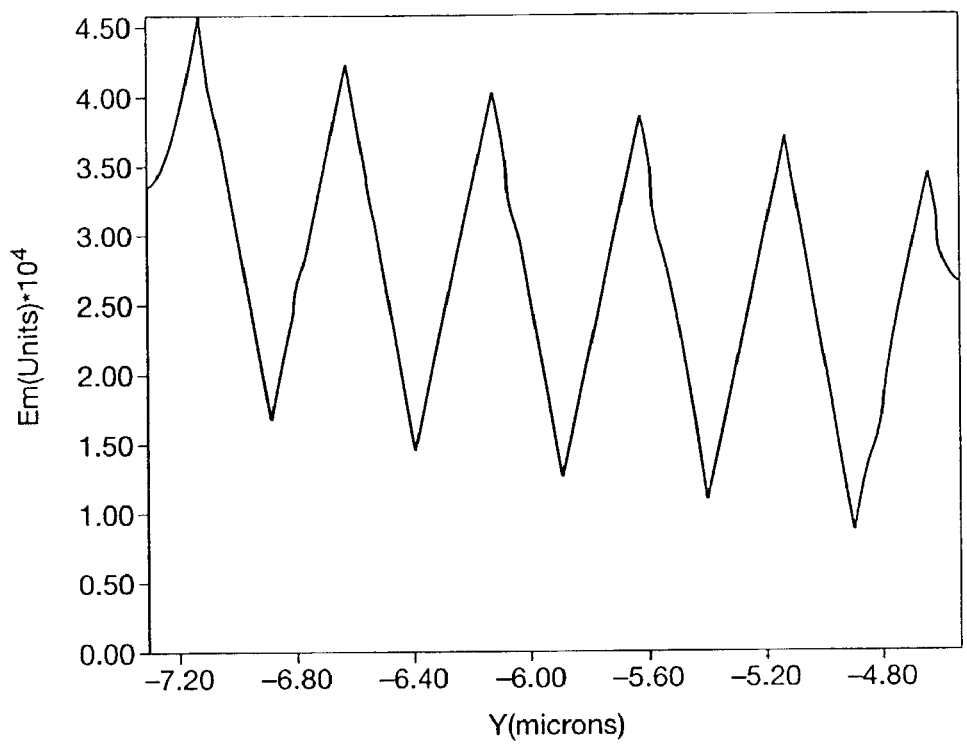
FIGS. 9 and 10 are graphs respectively showing the electric field through diode trenches and drift regions of an exemplary embodiment of the FIG. 4 MOSFET structure.
Figure 10:
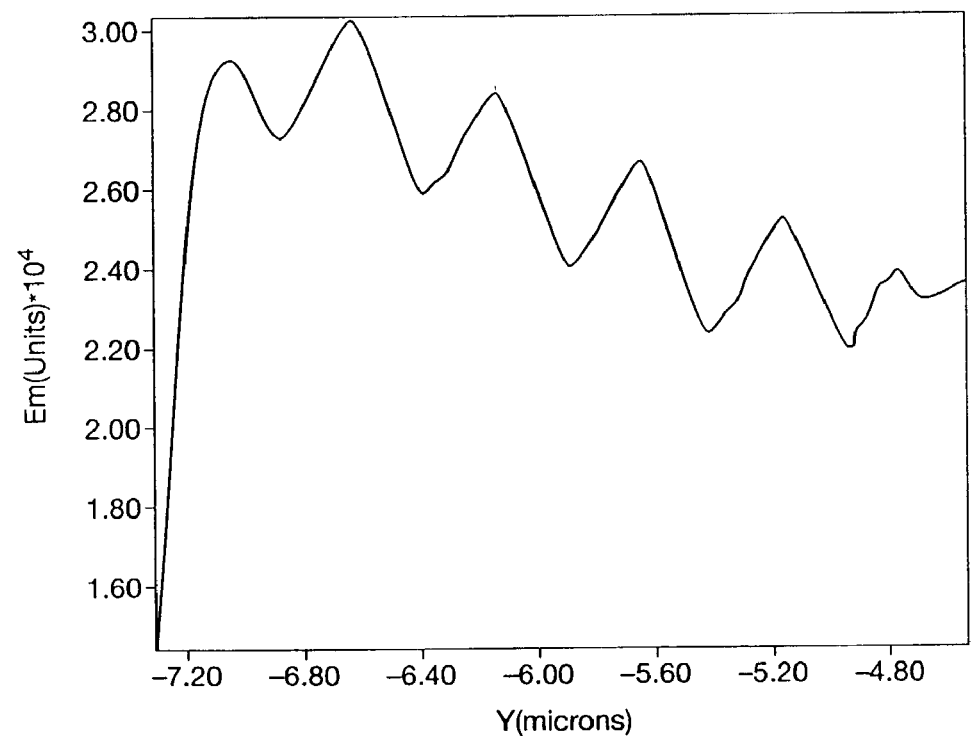

As shown in the FIG. 9 graph, the reverse-bias across the trench diodes results in an electric field peak at each diode junction (e.g., junction 413) as expected. Each of these electric field peaks induces a corresponding electric filed increase (peak) in a corresponding area of drift region 406 as shown in the FIG. 10 graph. An almost square-shaped area under the electric field curve is thus obtained (FIG. 10), which is substantially greater than the area under the triangular-shaped curve for conventional MOSFET structures. Thus, a substantial increase in the breakdown voltage is achieved. The larger the number of diodes embedded in the trench, the greater would be the number of peaks in the electric filed in the drift region, and thus the higher would be the area under the curve. The higher breakdown voltage enables the doping concentration of drift region 406 (conventionally kept low to obtain the necessary breakdown voltage) to be increased to reduce the on-resistance, if desired.

As described above in reference to the structure in FIG. 3A, during the on state of MOSFET 400, the electric field across the trench diodes influences the charge distribution in drift region 406 such that a more uniform charge spreading is obtained in drift region 406. The uniform charge spreading results in a more efficient use of the drift region silicon area. Thus, for the same on-resistance of, for example, the prior art FIG. 1 structure, the cell pitch of the FIG. 4 structure can be made smaller. The width of the diode trenches can be made as small as the process technology allows to minimize its impact on the cell pitch.

A method of forming structure 400 in accordance with one embodiment of the invention is as follows. Conventional process steps are carried out to form the buried gate structure 419, including source regions 424a,b, body regions 408a,b, and P+ regions 426a,b, in epitaxial layer 404. Alternatively, the process steps outlined in the above-referenced U.S. patent application (Ser. No. 08/970,221, titled "Field Effect Transistor and Method of its Manufacture"), commonly assigned, may be carried out to form the gate structure. Next, the same process steps and variations thereof described above in connection with forming trench 310 (FIG. 3A) and the diode embedded therein may be used to form deep trenches 410a,b and the multiple diodes embedded in them.

Generally, the order in which diode trenches 410a,b, body regions 408a,b, and gate trench 419 are formed is not limited to a particular sequence. For example, an alternate sequence to that described above is: form the diode trenches first, the body regions second, and the gate trench third. Another sequence is: form the gate trench first, the body regions second, and the diode trenches third. Accordingly, there are six possible sequence permutations, any one of which may be used.

Figure 5:
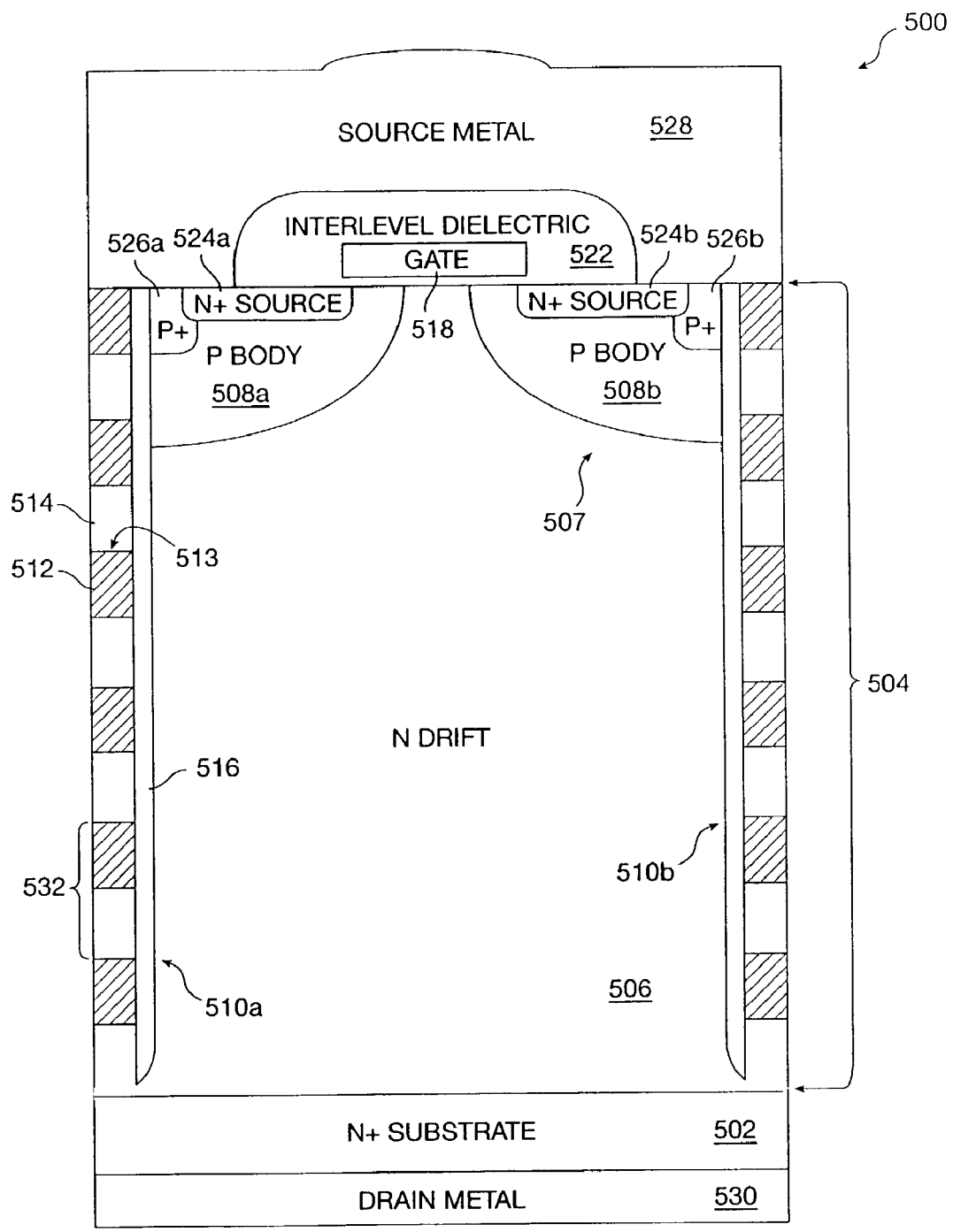

FIG. 5 shows a cross-section view of a MOSFET structure 500 in accordance with another embodiment of the present invention. A highly-doped substrate 502 forms an ohmic drain contact. An epitaxial layer 504 formed over substrate 502 includes source regions 524a,b formed in body regions 508a,b. Body regions 508a,b are each flanked on one side by diode trenches 510a,b. P+ regions 526a,b form the areas through which contact is made to body regions 508a,b. The portion of epitaxial layer 504 bounded by diode trenches 510a,b along the sides, body regions 508a,b and gate 518 along the top, and substrate 502 along the bottom forms drift region 506. The gate structure is planar similar to that shown in the FIG. 2 prior art structure 200. Metal layer 528 extends along the top and makes contact with sources region 524a,b, P+ regions 526a,b, and the top of trenches 510a,b, but is isolated from gate 518 by insulating layer 522. Metal layer 530 makes contact to substrate 502 along the bottom, forming the drain electrode.

Trenches 510a,b extend from the top surface of epitaxial layer 504 to the bottom of drift region 506. Diode trenches 510a,b are similar in structure to those in the FIG. 4 structure, and as such the same discussions provided above in connection with the FIG. 4 trench structure applies here. Briefly, in FIG. 5, the trench diodes are insulated from drift region 506 by insulating layer 516 extending along the trench sidewalls. Insulating layer 516 however, is discontinuous along the bottom of the diode trenches so that the bottom-most region in the trenches makes electrical contact with its underlying region.

Similar to the diodes in trenches 410a,b (FIG. 4), the diodes in trenches 510a,b are reverse-biased during MOSFET operation. Any one of the same techniques for reverse biasing the diodes in trenches 410a,b outlined above may be used here.

Figure 2:
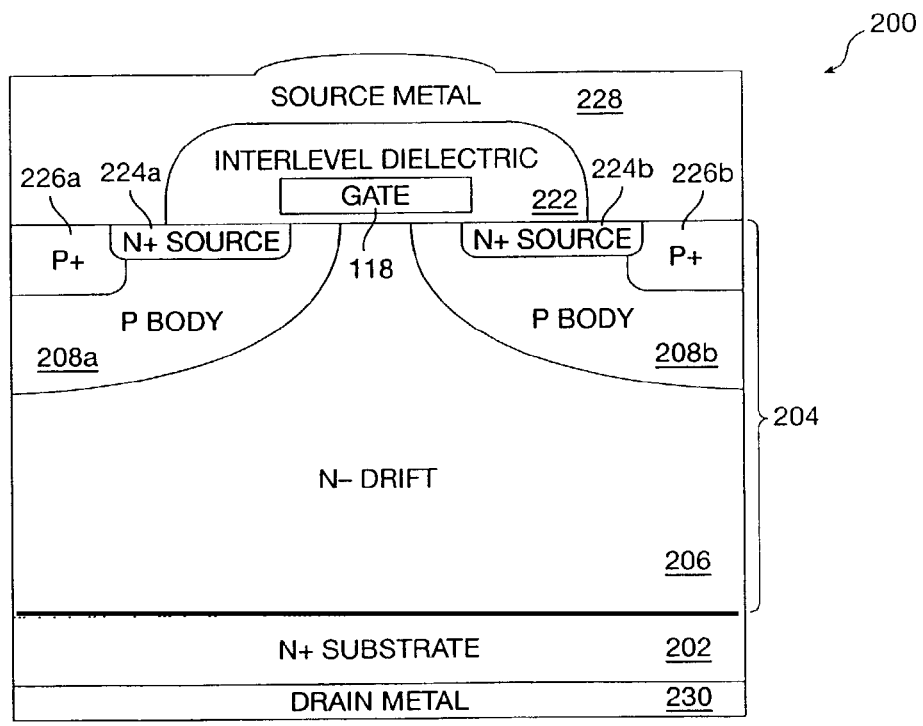

The operation of MOSFET 500 is similar to that of the prior art FIG. 2 structure and thus will not be described. Diode trenches 510a,b influence the electric field and the charge distribution in drift region 506 in a similar manner to diode trenches 410a,b (FIG. 4) so that a higher breakdown voltage, lower on-resistance, and smaller cell pitch is obtained as compared to the prior art FIG. 2 structure.

A method of forming structure 500 in accordance with one embodiment of the invention is as follows. Conventional process steps are carried out to form the planar gate structure. Deep trenches are then etched in the space between the planar gate structures. The same process steps and variations thereof described above in connection with forming deep trenches 410a,b (FIG. 4) and the diodes embedded therein may then be carried out to form deep trenches 510a,b and the diodes embedded therein. In an alternative embodiment, the process steps are reversed in that the deep trenches are formed first (using the same steps outlined above), and then the planar gate structure is formed between the diode trenches (using the same process steps outlined above).

Figure 6:
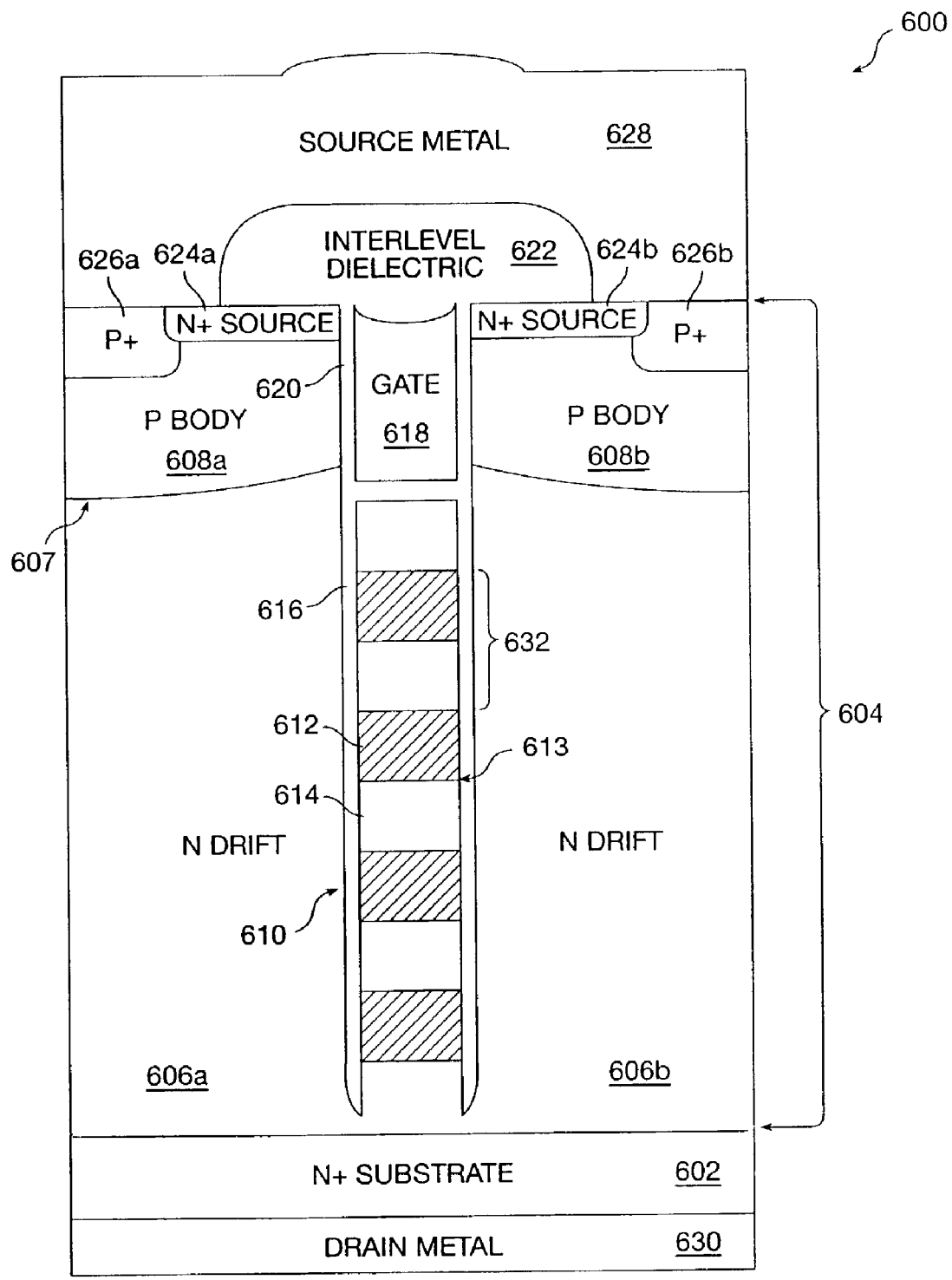

FIG. 6 shows a cross-section view of another MOSFET structure 600 in accordance with another embodiment of the present invention. As shown, MOSFET gate 618 and trench diodes 632 are advantageously embedded in one trench 610 rather than two as in the FIG. 4 structure 400. This yields a highly compact cell structure while the same breakdown voltage and on-resistance improvements of prior embodiments are maintained.

As shown, a highly-doped substrate 602 forms the drain contact. An epitaxial layer 604 formed over substrate 602 includes source regions 624a,b formed in body regions 608a,b. P+ regions 626a,b form the areas through which contact is made to body regions 608a,b. Body regions 608a,b are separated by trench 610. The portions of epitaxial layer 604 bounded by body regions 608a,b, substrate 602, and trench 610 form drift regions 606a,b. The structural relation between gate 618 and the source, body regions is similar to those in the FIG. 4 structure.

Trench 610 extends from the top surface of epitaxial layer 604 to the bottom of drift regions 606a,b. The lower section of trench 610 wherein the diodes are embedded is similar in structure to diode trenches 410a,b (FIG. 4), and as such the same discussions provided above in connection with the structure of trenches 410a,b applies here. Briefly, in FIG. 6, the diodes embedded in trench 610 are insulated from drift regions 606a,b by insulating layer 616 extending along the trench sidewalls. Insulating layer 616 however, is discontinuous along the bottom of the trench to allow the bottommost region in the trench to make contact with its underlying region. Insulating layer 616 may be the same as or different from gate oxide 620. Generally, insulating layer 616 needs to withstand the high voltage between the trench diode regions and drift regions 606a,b. Metal layer 628 extends along the top and makes contact to sources 624a,b and P+ regions 626a,b, but is insulated from gate 618 by insulating layer 622.

Similar to the diodes in trenches 410a,b (FIG. 4), the diodes in trench 610 are reverse-biased during MOSFET operation. Any one of the same techniques for reverse biasing the diodes in trenches 410a,b outlined above maybe used here.

The operation of MOSFET 600 is similar to that of the prior art FIG. 1 structure and thus will not be described. Diode trench 610 influences the electric field and the charge distribution in drift regions 606a,b in a similar manner to diode trenches 410a,b (FIG. 4) so that a high breakdown voltage, low on-resistance, and small cell pitch are obtained.

A method of forming structure 600 in accordance with one embodiment of the invention is as follows. An epitaxial layer 604 is formed over substrate 302 using conventional methods. A blanket P-well implant is carried out in accordance with known implant techniques to form a P-well. An anneal step may be carried out to drive the P-well deeper into epitaxial layer 604 and to activate the P dopants. A trench mask defining a trench opening is then formed by depositing and patterning a photoresist layer. Silicon is removed from the defined trench opening to form trench 610. The trench surfaces are then cleaned and a thin layer of thermal oxide is grown inside the deep trenches. A thicker (e.g. 200–600 nm) insulating layer (e.g., CVD oxide) is then deposited over the thin layer of thermal oxide. The sidewalls of the trench are thus coated with an insulating layer. The insulating material along the bottom of the trench is them removed. A suitable spacer material (e.g., nitride) may be used to protect the insulating material along the trench sidewalls during removal of insulation material at the trench bottom.

Although the above process steps results in insulating layers 616 and 620 to be the same, modifying the process steps so that these two insulating layers are different would be obvious to one skilled in this art. Next, the same process steps and variations thereof described above in connection with forming the diode in trench 310 (FIG. 3A) may be used to form the multiple diodes shown in trench 610. After forming the diodes, an insulating layer is formed over the top of the diode structure. Gate 618 is then embedded in trench 610 using conventional methods. In an alternative embodiment, the process steps are reversed in that the deep trench is formed first (using the same steps outlined above) and then body regions 608a,b are formed.

Figure 7A:
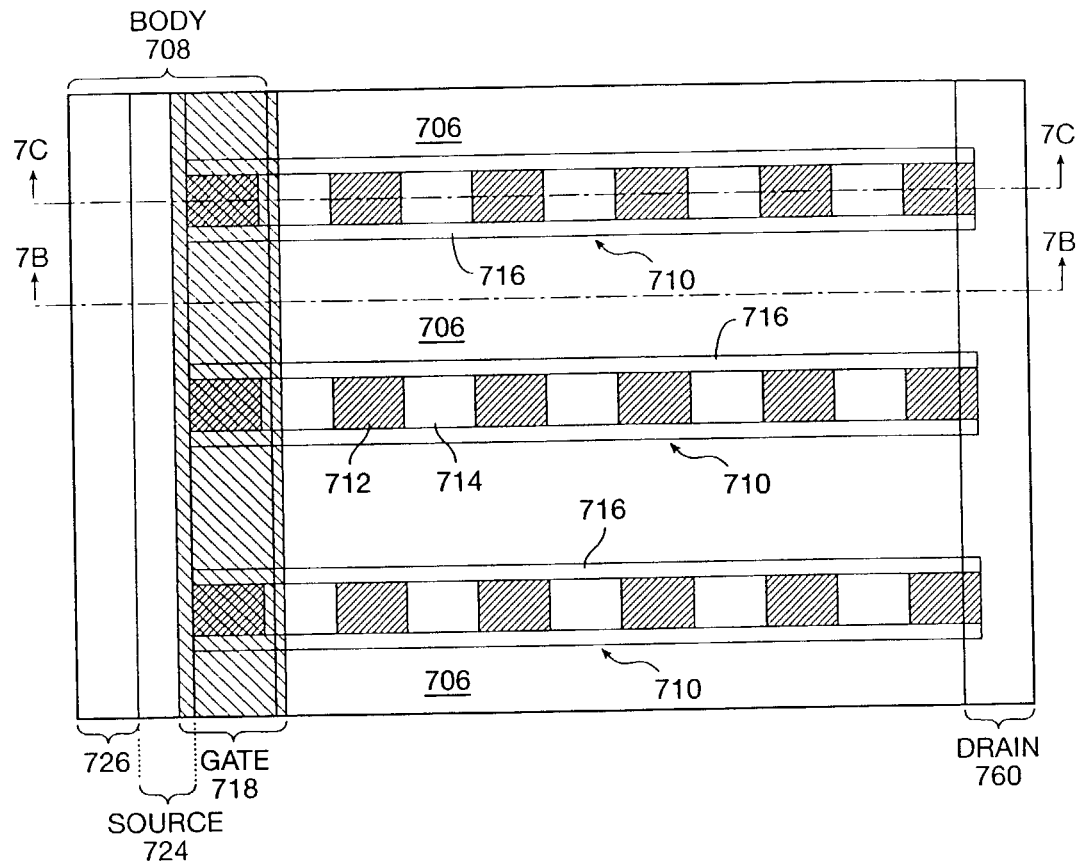
FIGS. 7A, 7B, and 7C respectively show a top view, a cross-section view along 7B—7B line in FIG. 7A, and a cross section view along 7C—7C line in FIG. 7A of a lateral MOSFET structure having diode trenches in accordance with the present invention.
Figure 7B:
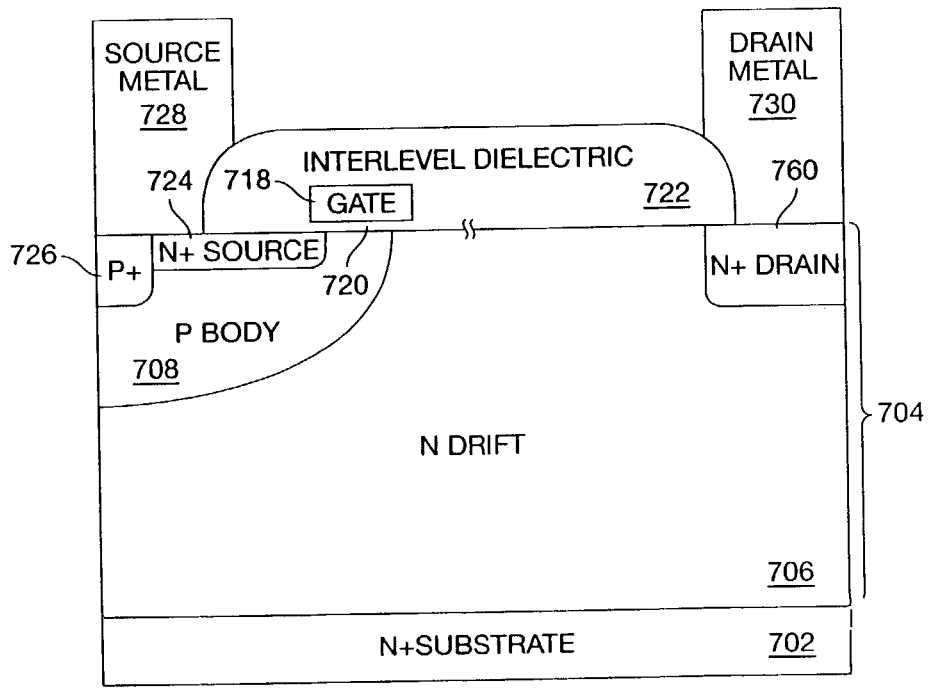
Figure 7C:
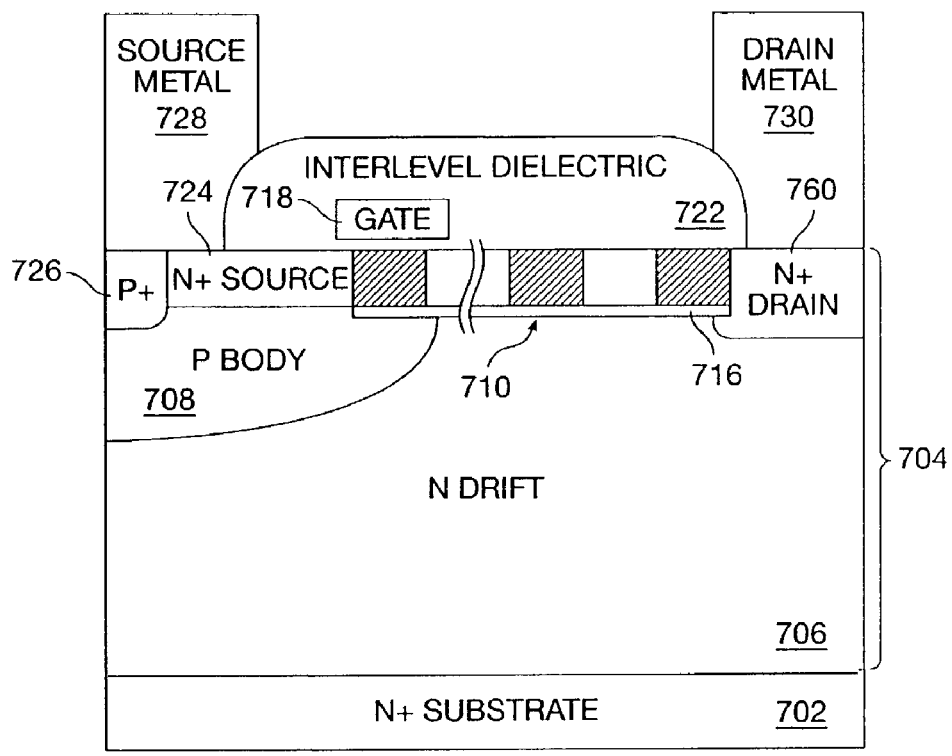

FIG. 7A shows a top view partial-layout diagram of a lateral MOSFET structure having diode trenches in accordance with the present invention. FIGS. 7B and 7C show cross-section views across 7B—7B and 7C—7C lines in FIG. 7A, and will be used together with the FIG. 7A top view to describe the structure of and method of forming the lateral MOSFET. As shown in these figures, both source region 724 and drain region 760 are formed along the same surface as opposed to two opposing surfaces as in the vertical structures. Thus, the current conduction occurs laterally along the top surface, hence "lateral MOSFET". In FIG. 7A, three trenches 710 are shown extending from drain region 760 to source region 724 through drift region 706 and body region 708. A number of P-type and N-type regions are alternately arranged adjacent one another forming a number of serially-connected diodes in each trench 710. The P-type and N-type regions are insulated from the drift region 706 and body region 706 by an insulating layer 716 extending along the bottom and sidewalls of trenches 710. Insulating layer 716 however does not extend along the trench sidewalls at the lateral ends of the trenches where they terminate in drain region 760 and body region 708. This allows the last diode region on each end of each trench to make electrical contact with its adjacent region (i.e., with drain region 760 on the right side and with source region 724 on the left side).

Line 7B—7B extends through the channel region, and the corresponding cross-section view shown in FIG. 7B is similar to that for conventional lateral MOSFET structures. The operation of this structure is thus similar to conventional lateral MOSFETs.

Line 7C—7C extends through one of the trenches 710, and the corresponding cross-section view is shown in FIG. 7C. An epitaxial layer 704 formed over substrate 702 includes body region 708 and drain region 760. P+ region 726 (the area through which ohmic contact is made to body region 708) and source region 724 are formed in body region 708. The portion of epitaxial layer 704 below and between body region 708 and drain region forms drift region 706. The gate structure is planar and is similar to that in conventional lateral MOSFETs except that gate 718 also extends over portions of diode trenches 710 as shown in FIG. 7A. Metal layer 728 makes contact with source region 724 and P+ region 726 but is isolated from gate 718 by insulating layer 722. Metal layer 730 makes contact to drain region 760.

The diodes in trenches 710 are reverse-biased during operation. This is achieved by having the right-most region in trenches 710 in contact with drain region 760 and the left-most region in contact with source region 724. Alternatively, the left-most region may be insulated from source region 724 and then connected to a low potential (e.g., ground) or even allowed to float. Also, the right-most region may be connected to a high potential separate from the drain. Generally, reverse biasing of the diodes can be achieved by connecting any of the N-type regions in the diode trenches to a high potential, or alternatively connecting any of the P-type regions in the trenches to a low potential.

During operation, diode trenches 710 influence the electric field and the charge distribution in drift region 706 in a similar manner to diode trenches 410a,b (FIG. 4) so that a higher breakdown voltage, lower on-resistance, and smaller cell pitch is obtained as compared to the conventional lateral MOSFET structures.

Although FIGS. 7A–7C show diode trenches 710 abutting source region 724, these trenches may alternatively terminate in body region 708 near the body-drift junction. This however requires that the left-most diode region be of the same conductivity type as body region 708 to eliminate any breakdown issues at the junction between the body region and the left-most diode region. Alternatively, insulating layer 716 may be extended along the left-end sidewall of the trenches so that the left-most diode region in the trenches is insulated from the source and body regions. In yet another embodiment, insulating layer 716 may be formed along all four sidewalls of the trenches so that the diodes are completely insulated on all sides. This however requires that access be provided to at least one of the diode regions in each trench so that the diodes can be reverse biased during operation. Such access may be provided along the top side of the structure by creating one or more openings in the insulating layer 722 and electrically contacting one or more of the diode regions in the trench. 1711 A method of forming the lateral MOSFET structure shown in FIGS. 7A–7C in accordance with one embodiment of the invention is as follows. An epitaxial layer 704 is formed over substrate 702 using conventional methods. A trench mask defining trench openings is then formed by depositing and patterning a photoresist layer. Silicon is removed from the defined trench openings to form trenches in the epitaxial layer. The trench surfaces are then cleaned and a thin layer of thermal oxide is grown inside the deep trenches. A thicker (e.g. 200–600 nm) insulating layer (e.g., CVD oxide) is then deposited over the thin layer of thermal oxide. The sidewalls and bottom of the trenches are thus coated with an insulating layer. The insulating material along two sidewalls (i.e., those closest to where the drain and source regions are later formed) are removed. A suitable spacer material (e.g., nitride) may be used to protect the insulating material along the other two sidewalls and the bottom of the trenches during removal of insulation material.

If polysilicon is to be used in forming the trench diodes, polysilicon is first deposited and then a planarization etch is carried out so that only those portions of the polysilicon filling the trenches remain. If the deposited polysilicon is doped polysilicon, a masking and implanting sequence of steps is carried out to form the diodes (i.e., to form alternating regions of opposite conductivity). If the deposited polysilicon is undoped, then the masking and implanting sequence of steps need to be carried out twice to create the regions of opposite conductivity. If silicon is to be used in forming the trench diodes, silicon is deposited in the trenches followed by one or two sets of masking and implanting sequence of steps (depending on whether the deposited silicon is doped) to create the alternating regions of opposite conductivity type.

Next the gate oxide and the overlying gate are formed in accordance with conventional methods. Using a mask, a blanket P-well implant is carried out in accordance with known implant techniques to form a P-well. An anneal step may be carried out to drive the P-well deeper into epitaxial layer 304 and to activate the P dopants. Source region 724, drain region 760, and P+ region 726, insulating layer 722, and metal layers 728 and 730 are then formed in accordance with conventional methods.

In one embodiment, a buried layer is formed between substrate 702 and drift region 706, wherein the buried layer has a conductivity type opposite that of the substrate and drift region. In another embodiment, the lateral MOSFET structure is formed using silicon-on-insulator (SOI) technology. In this embodiment, an insulating layer would be present between drift region 706 and substrate 702.

Figure 8:
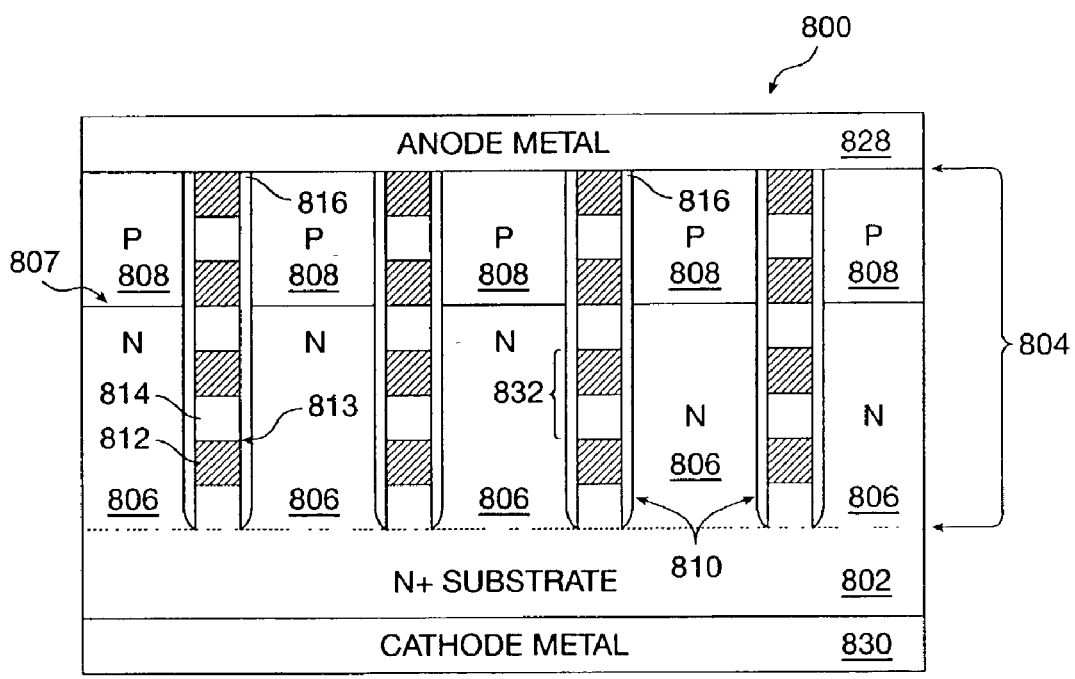
FIG. 8 shows a cross-section view of a rectifier having diode trenches in accordance with the present invention.

FIG. 8 shows a cross-section view of a power diode device 800 in accordance with an embodiment of the present invention. A highly-doped substrate 802 forms the cathode contact. An epitaxial layer 804 formed over substrate 802 includes P-well regions 808 each being flanked on the sides by trenches 810. The regions of epitaxial layer 804 bounded by trenches 810 along the sides, P-well regions 808 along the top, and substrate 802 along the bottom form drift regions 806. Metal layer 828 makes contact to P-well regions 808 and the top surface of trenches 810, and forms the anode electrode. Metal layer 830 extends along the bottom and makes contact to substrate 802, forming the cathode electrode.

Trenches 810 extend from the top surface of epitaxial layer 804 to the bottom of drift region 806. Trenches 810 are similar in structure to trenches 410a,b (FIG. 4), and as such the same discussions provided above in connection with trenches 410a,b apply here. Briefly, in FIG. 8, the diodes in trenches 810 are insulated from P-well regions 808 and drift regions 806 by insulating layer 816 extending along the trench sidewalls. Insulating layer 816 however, is discontinuous along the bottom of the trenches so that the bottom-most region in the trenches makes electrical contact with its underlying region.

Similar to the diodes in trenches 410a,b (FIG. 4), the diodes in trenches 810 are reverse-biased during device operation. Any one of the same techniques for reverse biasing the diodes in trenches 410a,b outlined above may be used to ensure that the diodes in trenches 810 are reverse-biased during operation.

Trenches 810 influence the electric field and the charge distribution in drift regions 806 in a similar manner to diode trenches 410a,b (FIG. 4) so that a higher breakdown voltage, lower on-resistance, and smaller cell pitch is obtained as compared to conventional power diodes. The same process steps and variations thereof described above in connection with forming structure 300 (FIG. 3) may be used to form structure 800.

Although the invention has been described using different NMOS power devices and a power diode, its implementation in other types of known power devices (e.g., lateral diodes, bipolar transistors, other MOS-gated devices such as IGBTs) would be obvious to one skilled in this art in view of this disclosure. Further, other than high voltage devices, the structure and method of the present invention can be used to implement mid to low voltage (e.g., <200V) devices. As is well known in this art, in contrast to high-voltage power devices wherein the majority of the losses occur in the drift region, in mid to low voltage devices, the majority of losses occur in the channel region. The present invention lends itself well to implementing mid to low voltage devices in that the cell pitch can be substantially reduced (as described above) so that a larger number of cells can be formed in a give silicon area, and thus the losses in the channel region are reduced.

While the above is a complete description of the embodiments of the present invention, it is possible to use various alternatives, modifications and equivalents. For example, in an alternative implementation of the FIGS. 4, 5, 7, and 8 structures, only one region may be used in the portion of the diode trench(es) extending from the side of the trench closest to the source region to the vicinity of the edge of the drift-body junction. For example, in FIGS. 4, 5, and 8 the top three regions in the diode trench(es) may be replaced with one elongated P-type or N-type region. Alternatively, an insulating material (e.g., oxide) may be used in place of the elongated P-type region. In either case, the number of processing steps associated with forming the diodes in the trench(es) is reduced without adversely impacting the performance of the different structures. In yet another implementation of the diode trench(es) in FIGS. 4–6 and 8 rather than extending the trench(es) clear through the drift region, they may be terminated at a shallower depth within (e.g., in the middle of) the drift region if desired. Similarly, in FIG. 7C, the diode trenches may be terminated within epitaxial layer 706 rather than extend all the way to drain region 760. The cross-section views of the different embodiments may not be to scale, and as such are not intended to limit the possible variations in the layout design of the corresponding structures. Therefore, the scope of the present invention should be determined not with reference to the above description but should, instead, be determined with reference to the appended claim, along with their full scope of equivalents.

What is claimed is:

1. A semiconductor structure comprising:
a semiconductor region comprising a P-type region and a N-type region forming a PN junction therebetween; and
a first trench extending in the semiconductor region adjacent at least one of the P-type and N-type regions, the first trench having at least one diode therein, the at least one diode being at least partially insulated from at least one of the P-type and N-type regions by an insulating layer, wherein no current flows through the first trench when the semiconductor structure is biased in a conducting state, and wherein the at least one diode influences an electric field in at least one of the P-type and N-type regions to thereby increase the blocking voltage of the semiconductor structure.

2. The semiconductor structure of claim 1 wherein the at least one diode is reverse biased during semiconductor structure operation.

3. The semiconductor structure of claim 1 wherein the insulating layer extends along sidewalls of the first trench but is discontinuous along the bottom of the first trench.

4. The semiconductor structure of claim 1 wherein the semiconductor region is an epitaxial layer formed over and in contact with a substrate.

5. The semiconductor structure of claim 1 wherein one of the P-type and N-type regions forms a drift region, the at least one diode being arranged in the first trench so that when the semiconductor structure is biased in a blocking state an electric field induced in the at least one diode influences an electric field in the drift region to thereby increase the blocking voltage of the semiconductor structure.

6. The semiconductor structure of claim 1 wherein one of the P-type and N-type regions forms a drift region, the at least one diode being arranged in the first trench so that when the semiconductor structure is biased in a blocking state an electric field induced in the at least one diode results in a uniform charge distribution in the drift region.

7. The semiconductor structure of claim 1 wherein the at least one diode includes N-type and P-type regions alternately stacked on top of one another in the trench.

8. The semiconductor structure of claim 1 wherein the at least one diode includes N-type and P-type regions alternately arranged adjacent one another parallel to a surface of the semiconductor structure.

9. The semiconductor structure of claim 1 wherein the at least one diode comprises a P-type silicon layer and a N-type silicon layer.

10. The semiconductor structure of claim 1 wherein the at least one diode comprises a P-doped polycrystalline silicon material and a N-doped polycrystalline silicon material.

11. The semiconductor structure of claim 1 wherein the semiconductor structure is a MOSFET further comprising a second trench in the semiconductor region, the second trench having a gate therein and being laterally spaced from the first trench.

12. The semiconductor structure of claim 1 wherein the semiconductor structure is a MOSFET further comprising a planar gate structure along a surface region of the semiconductor region, the gate structure being laterally spaced from the first trench.

13. The semiconductor structure of claim 1 wherein the semiconductor structure is a MOSFET and the first trench further includes a gate over but insulated from the at least one diode.

14. The semiconductor structure of claim 1 wherein the semiconductor structure is a MOSFET further comprising a gate, a drain, and a source, the at least one diode being electrically connected between the drain and source.

15. The semiconductor structure of claim 1 wherein the semiconductor structure is a MOSFET further comprising a drain terminal and a source terminal located along two opposite surfaces of the semiconductor structure, the first trench extending vertically between the drain terminal and the source terminal.

16. The semiconductor structure of claim 15 wherein the at least one diode includes P-type and N-type regions alternately stacked on top of each other.

17. The semiconductor structure of claim 1 wherein the semiconductor structure is a MOSFET further comprising a drain terminal and a source terminal both located along one surface of the semiconductor structure, the trench extending laterally between the drain terminal and the source terminal.

18. The semiconductor structure of claim 17 wherein the at least one diode includes P-type and N -type regions alternately arranged adjacent one another along the lateral dimension.

19. The semiconductor structure of claim 1 wherein the semiconductor structure is a rectifier having an anode terminal electrically connected to one of the P-type and N-type regions and a cathode terminal electrically connected to the other one of the P-type and N-type regions.

20. The semiconductor structure of claim 19 wherein the anode and cathode terminals are located along two opposite surfaces of the rectifier, the first trench extending vertically between the anode and cathode terminals, and the at least one diode comprises P-type and N-type regions alternately stacked on top of each other in the first trench.

21. The semiconductor structure of claim 1 wherein the first trench is a narrow and deep trench extending vertically between two opposite surfaces of the semiconductor structure.

22. The semiconductor structure of claim 1 wherein the first trench is a wide and shallow trench extending laterally parallel to a surface of the semiconductor structure.

23. A semiconductor structure comprising:
a semiconductor region having a body region and a drift region forming a PN junction;
a first trench extending at least in the drift region; and
at least one diode in the first trench, the at least one diode being at least partially insulated from at least one of the body and drift regions by an insulating layer, wherein no current flows through the first trench when the semiconductor structure is biased in a conducting state, and wherein the at least one diode influences an electric field in at least the drift region to thereby increase the blocking voltage of the semiconductor structure.

24. The semiconductor structure of claim 23 wherein the at least one diode is reverse biased during semiconductor structure operation.

25. The semiconductor structure of claim 23 wherein the insulating layer extends along sidewalls of the first trench but is discontinuous along the bottom of the first trench.

26. The semiconductor structure of claim 23 wherein the semiconductor region is an epitaxial layer formed over and in contact with a substrate.

27. The semiconductor structure of claim 23 wherein the semiconductor structure is any one of a vertically-conducting MOSFET, a laterally-conducting MOSFET, and a rectifier.

28. The semiconductor structure of claim 23 wherein when the semiconductor structure is biased in a blocking state an electric field induced in the at least one diode influences an electric field in the drift region to thereby increase the blocking voltage of the semiconductor structure.

29. The semiconductor structure of claim 23 wherein when the semiconductor structure is biased in a blocking state an electric field induced in the at least one diode results in a more uniform charge distribution in the drift region.

30. The semiconductor structure of claim 23 wherein the first trench is a narrow and deep trench extending vertically between two opposite surfaces of the semiconductor structure.

31. The semiconductor structure of claim 23 wherein the first trench is a wide and shallow trench extending laterally parallel to a surface of the semiconductor structure.

32. A semiconductor structure comprising:
a substrate;
an epitaxial layer over and in contact with the substrate, the epitaxial layer having a body region and a drift region forming a PN junction, the drift region being of the same conductivity type as the substrate;
a plurality of laterally spaced trenches each extending through at least a portion of the drift region; and
a plurality of diodes in each of the plurality of trenches, the plurality of diodes in each trench being insulated from the drift region along the trench sidewalls, wherein at least one of the plurality of diodes in each trench influences an electric field in at least the drift region to thereby increase the blocking voltage of the semiconductor structure.

33. The semiconductor structure of claim 32 wherein the plurality of diodes are positioned in each of the plurality of trenches such that an electric field induced in one or more of the plurality of diodes influences an electric field in the drift region such that a blocking voltage of the semiconductor structure is increased.

34. The semiconductor structure of claim 32 wherein each of the plurality of trenches further includes an insulating layer extending along the trench sidewalls but being discontinuous along the bottom of the trench.

35. The semiconductor structure of claim 32 further comprising at least two terminals located along opposite surfaces of the semiconductor structure, the at least two terminals being configured to bias the semiconductor structure during operation,
wherein the plurality of trenches extend vertically between the two terminals, and the plurality of diodes in each trench includes P-type and N-type regions alternately stacked on top of each other in each trench.

36. The semiconductor structure of claim 32 further comprising at least two terminals located along one surface of the semiconductor structure, the at least two terminals being configured to bias the semiconductor structure during operation,
wherein the plurality of trenches extend laterally between the two terminals, and the plurality of diode in each trench includes P-type and N -type regions alternately arranged adjacent one another along the lateral dimension.

37. The semiconductor structure of claim 32 wherein the semiconductor structure is any one of a vertically-conducting MOSFET, a laterally-conducting MOSFET, and a rectifier.

38. The semiconductor structure of claim 32 wherein the plurality of diodes in each trench are reverse-biased during operation.

39. The semiconductor structure of claim 1 wherein the at least one diode is arranged parallel to a current flow established when the semiconductor structure is biased in an on state.

40. The semiconductor structure of claim 23 wherein the at least one diode is arranged parallel to a current flow through the drift region established when the semiconductor structure is biased in an on state.

41. The semiconductor structure of claim 32 wherein the plurality of diodes are arranged parallel to a current flow in the drift region established when the semiconductor structure is biased in an on state.

* * * * *